(12) United States Patent
Richard et al.

(10) Patent No.: US 7,030,699 B2
(45) Date of Patent: Apr. 18, 2006

(54) AMPLIFIER

(75) Inventors: Patrick E. Richard, Edinburgh (GB); John L. Pennock, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 53 days.

(21) Appl. No.: 10/841,454

(22) Filed: May 10, 2004

(65) Prior Publication Data
US 2005/0110574 A1 May 26, 2005

(30) Foreign Application Priority Data
Nov. 26, 2003 (GB) .................................. 0327539

(51) Int. Cl.
*H03F 3/04* (2006.01)
(52) U.S. Cl. ...................... 330/297; 330/310
(58) Field of Classification Search ................ 330/297, 330/310, 311, 69, 252
See application file for complete search history.

(56) References Cited

U.S. PATENT DOCUMENTS

| | | | |
|---|---|---|---|
| 4,546,327 A | | 10/1985 | Suzuki et al. |
| 5,068,623 A | * | 11/1991 | Camin et al. ................ 330/277 |
| 5,199,079 A | * | 3/1993 | Anderson et al. .......... 381/94.5 |
| 5,289,137 A | | 2/1994 | Nodar et al. |
| 5,907,262 A | * | 5/1999 | Graeme et al. ............. 330/255 |
| 6,396,352 B1 | | 5/2002 | Muza |

| | | |
|---|---|---|
| 2003/0138112 A1 | 7/2003 | Doy |

FOREIGN PATENT DOCUMENTS

| | | |
|---|---|---|
| GB | 1 467 649 | 3/1977 |
| JP | 8-046436 | 2/1996 |

OTHER PUBLICATIONS

TLE2662 Datasheet, "Dual μPower JFET-Input Operational Amplifier with Switched-Capacitor Voltage Converter", Texas Instruments Inc., 1994.

* cited by examiner

*Primary Examiner*—Henry Choe
(74) *Attorney, Agent, or Firm*—Dickstein Shapiro Morin & Oshinsky LLP

(57) ABSTRACT

An amplifier is disclosed, having an input stage connected to an output stage. The input stage is connected between a positive supply rail and a ground rail and has an input terminal arranged to receive an input signal. The output stage is connected between a positive supply rail and a negative supply rail and has an output terminal. The output stage is adapted to generate an output signal, which is dependent on a received input signal, at the output, and is further adapted such that, in use, a quiescent voltage at the output terminal is at a selected value between a voltage on the positive supply rail and a voltage on the negative supply rail. For driving a grounded load, the quiescent output voltage is preferably zero volts. In preferred embodiments, the input and output stages are formed on a common substrate using CMOS technology, the output stage including one or more NMOS devices having a triple-well structure. A corresponding method of driving a grounded load is also disclosed.

28 Claims, 9 Drawing Sheets

AMPLIFIER

FIELD OF THE INVENTION

The present invention relates to amplifiers, and in particular, although not exclusively, to audio amplifiers suitable for incorporation with complex other digital or analog circuits on a single integrated circuit, for driving speakers or headphones connected to ground.

BACKGROUND TO THE INVENTION

Many integrated audio amplifiers use a single supply (at supply voltage Vdd, typically 5V) and generate an output signal with quiescent voltage of about Vdd/2. Thus a.c. coupling is needed to provide an output signal referenced to ground, as required for connection to other equipment or speakers or headphones connected to ground. For low impedance loads such as speakers or headphones, these a.c. coupling capacitors need to be big to maintain good bass response (for driving a 16 ohm load, a 470 uF coupling capacitor is required for a −3 dB point at 20 Hz). The physical size of these coupling capacitors is especially significant for portable systems, and their cost is significant for low-cost systems. Also, the coupling capacitors need charging up (to Vdd/2) on power-up, and need to discharge on power-down or even during temporary power-saving idle modes of operation. This results in annoying clicks and thumps from the speakers or headphones unless special precautions are taken to prevent them. This generally requires extra switch transistors and resistors off-chip (since they need to connect to the terminal of the capacitor remote from the chip). These effects are observed, and extra components are needed to eliminate them, even if the output load is of higher impedance and the coupling capacitors are smaller, e.g. for line outputs driving 10 kohm loads.

Accordingly, it would be desirable to use an amplifier providing a drive out signal balanced at ground potential (0V), to avoid the space requirements and cost of the extra components. In other words, it would be desirable to use an amplifier whose quiescent output voltage was at ground potential, so that coupling capacitors were not required when driving a grounded load.

One attempted solution to this problem is disclosed in US2003/0138112A1. That document discloses a headphone driver system which incorporates a DC voltage-to-voltage converter arranged to generate a negative supply voltage from a positive supply voltage. The system incorporates headphone driver amplifiers, supplied with the positive supply voltage and the generated negative supply voltage, and arranged to produce output signals biased at ground potential (0V). Thus, although the system operates from a single voltage supply, large coupling capacitors between the amplifiers and the headphone inputs are not required. In a described embodiment, the voltage-to-voltage converter comprises a charge pump and relatively small (i.e. 1–10 uF) external capacitors. However, although the use of large coupling capacitors is avoided, the incorporation of the voltage-to-voltage converter clearly increases the complexity, and hence cost, of the amplifier system.

To reduce system cost, it would be desirable to use a low-cost negative supply generator, for example in the form of a simple, unregulated capacitor charge pump. For certain applications, it would be desirable to incorporate at least part of the negative supply generating circuitry on the same chip as other amplifier components. However, a problem with low-cost, simple negative supply generators is that they tend to be noisy (good output voltage regulation, e.g. using a linear post-regulator, which generally requires large decoupling capacitors of its own, would necessitate increased complexity and cost). Most regulators, especially low-drop-out ones, have bandwidths below audio frequency, so it is difficult to suppress audio-frequency components of supply ripple or provide good load regulation at audio frequency without using large decoupling capacitors on input and output. Operation of a headphone amplifier, for example, from a clean positive supply and a noisy negative supply could lead to unacceptably high levels of noise on the generated output signal unless special precautions are taken to give the amplifier high supply rejection at audio frequencies and above.

Whether the negative supply is generated from the positive supply or is provided by an independent source, the integration of an amplifier operating from the dual (i.e. positive and negative) supply with other circuits on a single chip poses further problems. The circuits (for processing and handling of digital and analog signals) that one would like to integrate with the amplifier are typically designed to operate between a single positive supply and ground. Clearly, it is undesirable to have to modify established circuit arrangements for compatibility, i.e. for dual-supply operation.

Increasingly, and especially as a result of the growth of digital audio systems, it is becoming desirable to embed amplifiers on the same silicon substrate as other digital and audio signal processing circuits. Such integrated circuits are most cost-effectively implemented using smaller geometry processes than have typically been used in the past. It is desirable to implement the circuits using technologies which provide feature dimensions typically as small as 0.35 um, 0.25 um or even smaller. In such technologies, supply voltages are typically limited to 3.3V or 2.5V. Complementary MOS (CMOS), which utilises PMOS and NMOS technologies combined on a single silicon wafer, is perhaps the most cost-effective of the current technologies, compared say with BiCMOS or any specialised process incorporating additional device structures for high-voltage outputs. It would be desirable to provide an amplifier integrated with other circuits on a CMOS chip, or at least fabricated on a CMOS process with a small number of additional manufacturing steps. However, CMOS chips are conventionally arranged for single supply operation. The p-type substrate is connected to ground, so no n-type region (e.g. NMOS source or drain) can be biased more than a diode drop below ground.

Furthermore, the supply voltage limitations for CMOS devices conflict with legacy standards for analogue audio signal interfaces. For example, audio "line level" signals are conventionally required to be 2V rms (approximately 5.6V p—p, which is greater than even 3.3V). These requirements are unlikely to reduce, because of pressure for ever increasing performance and the need for headroom above fixed or increasing extraneous interference.

Thus, there is a need for audio output stages to be integrated with existing single-supply cell libraries to implement audio SoCs (which stands for "System-on-Chip" i.e. large chips with ~1M gates implementing a DVD player or mobile phone, for example, on one or few chips), using standard-process CMOS at 0.25 um or so, with outputs swinging negative on an otherwise predominantly single-supply chip, with up to 2V rms o/ps depending on the application.

Embodiments of the present invention aim to provide amplifiers which overcome, at least partially, one or more of the above-mentioned problems associated with the prior art.

SUMMARY OF THE INVENTION

According to a first aspect of the present invention there is provided an amplifier comprising an input stage connected to an output stage, the input stage being connected between a positive supply rail and a ground rail and having an input terminal arranged to receive an input signal, the output stage being connected between a positive supply rail and a negative supply rail and having an output terminal, the output stage being adapted to generate an output signal, dependent on a received input signal, at said output terminal, and being further adapted such that, in use, a quiescent voltage at said output terminal is at a selected value between a voltage on the positive supply rail and a voltage on the negative supply rail.

It will be appreciated that the term "supply rail" is being used in a broad sense, simply meaning some part, component, node, region or regions of the amplifier circuitry to which a supply voltage is connected when the amplifier is in use. Similarly, "ground rail" refers to some part, component, node, region or regions of the circuitry which, in use, is at ground potential.

The input stage may be connected directly to the output stage in certain embodiments. In alternative embodiments, the input and output stages may be connected indirectly, for example by means of a further stage.

This first aspect of the invention provides the advantage that any noise on the negative supply is not coupled directly to the input stage, which is powered from a single positive supply rail. Even if the negative supply is noisy, it is kept away from the input stage, which accordingly need not be arranged to be especially insensitive. The amplifier will typically employ negative feedback to the input stage and this effectively attenuates any noise injected into the output stage (for example from a noisy negative supply) by the forward gain to that point.

For some applications it may be desirable to set the quiescent output voltage at some non-zero level. However, for many applications, and especially for driving grounded loads such as speakers and headphones, the output stage is preferably arranged such that at quiescent conditions the output terminal is at (or close to) ground potential (i.e. zero volts). In practical circuits the output terminal quiescent voltage can be set at ground potential to within +/−a few (i.e. <<10) millivolts. This is usually limited by transistor offset voltages.

Preferably, the amplifier is also adapted such that a quiescent voltage at said input is substantially ground potential.

Conveniently, the input and output stages are connected to a common positive supply rail.

In certain preferred embodiments the input and output stages are integrated on a common substrate, the common substrate being connected to the ground rail.

In such embodiments, the output stage preferably comprises at least one NMOS device, the NMOS device comprising a plurality of n+ source and drain regions (i.e. implants or diffusions) arranged in a pwell, the pwell being isolated from the common p-substrate by an nwell, and the isolated pwell being connected to the negative supply rail. Thus, the NMOS output is arranged in a triple well structure. By isolating the pwell (to which the negative supply is connected) from the p-type substrate in this way, the ampli-fier stage which operates from the dual supply can be integrated on the same chip as the input stage, and indeed other circuits, without requiring any modification of the input stage or other circuits. They are still located on a chip having a grounded substrate, and can be implemented in CMOS technology using established and standard circuit design techniques.

In preferred embodiments the output stage may comprise first and second output transistors connected in series with each other between the positive and negative supply rails, the output terminal of the output stage being connected to a node between the first and second output transistors.

More preferably, the amplifier may further comprise third and fourth output transistors connected in cascode arrangement with the first and second output transistors respectively. The cascode arrangement is advantageous as it protects the transistors from excessive voltage stress.

The amplifier may further comprise first and second drive transistors connected in parallel between a gate of the first output transistor and a gate of the second output transistor. Similarly, the amplifier may further comprise third and fourth drive transistors connected in cascode arrangement with the first and second drive transistors respectively.

In certain embodiments, the input stage may comprise a folded cascode arrangement of transistors. This may drive the output stage directly, although in preferred embodiments an intermediate stage may be used to increase loop gain, reduce distortion and improve audio-frequency supply rejection.

Preferably, the input and output stages are implemented in CMOS technology on a common substrate.

Advantageously, the amplifier may further comprise a third stage, connected between the input stage and the output stage, the third stage being connected between the same positive supply and ground rails as the input stage.

The third (intermediate) stage is preferably non-inverting, and may comprise a common-source stage driving a PMOS mirror arrangement. It may further comprise a source-follower stage driving the common-source stage.

Preferably, the input, output, and third stages are integrated on a common substrate.

In a preferred embodiment, the further comprises a digital-to-analogue converter (DAC) arranged to receive a digital signal and output a corresponding analogue signal to the input of the input stage. The input and output stages and the DAC may again be integrated on a common substrate.

Preferably, the amplifier further comprises a generating circuit arranged to generate a negative supply voltage from a positive supply voltage, the generating circuit being connected to the same positive supply rail as the output stage, and the negative supply rail being connected to an output of the generating circuit.

Thus, from a single positive supply, the amplifier may be arranged to generate an output signal, centred on zero volts, which can swing both positive and negative. This signal can be supplied to other equipment connected to ground, and indeed can be used to drive loads such as speakers and headphones connected to ground.

Preferably, the generating circuit is arranged to generate, in use, a negative supply voltage equal in magnitude to a positive voltage on the positive supply rail.

Advantageously, the generating circuit may comprise a charge pump, which conveniently may be an unregulated capacitor charge pump. Although this gives a noisy generated negative supply, the components to which this voltage is applied in a CMOS implementation can be isolated using triple well structures to reduce the effects of this noise on the input stage(s).

The generating circuit (e.g. charge pump) may be at least partially integrated on a common substrate with the input and output stages.

In use, the amplifier will further comprise a power supply connected to the positive supply rail.

According to a second aspect of the invention there is provided a method of driving a load connected to ground, the method comprising the steps of: providing an input signal to the input terminal of an amplifier input stage, the input stage being connected to an output stage; connecting the input stage between a positive supply voltage and ground; connecting the output stage between a positive supply voltage and a negative supply voltage to provide a quiescent output voltage of substantially zero volts at an output terminal of the output stage; using the output stage to generate an output signal at said output terminal, the output signal being dependent on the input signal; and connecting the load to the output terminal to drive the load with the output signal.

Preferably, the method further comprises the steps of forming the amplifier input stage and the output stage on a common substrate, and connecting the common substrate to ground. The step of forming the output stage then preferably comprises the step of forming at least one NMOS device, the NMOS device comprising a plurality of n+ source and drain regions arranged in a pwell, the pwell being isolated from the common substrate by an nwell, and the step of connecting the isolated pwell to the negative supply voltage.

Preferably, the method further comprises the step of generating the negative supply voltage from the positive supply voltage.

BRIEF DESCRIPTION OF THE DRAWINGS

Embodiments of the invention will now be described with reference to the accompanying drawings, by way of example only and without intending to be limiting, of which.

DETAILED DESCRIPTION OF THE PREFERRED EMBODIMENTS

Figure 1:
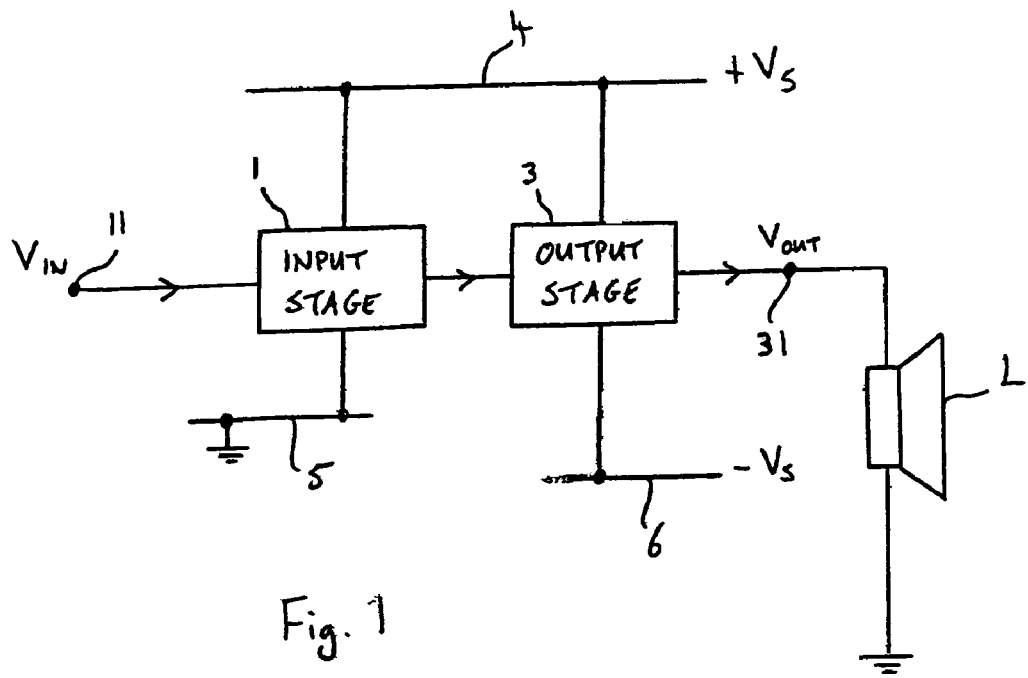
FIG. 1 is a schematic representation of a two-stage amplifier embodying the invention.

Referring now to FIG. 1, this shows, in highly schematic form, an amplifier embodying the invention. The amplifier is a two-stage amplifier, having an input stage 1 connected to an output stage 3. The input stage 1 has an input terminal 11 arranged to receive an input signal Vin for amplification. The amplified signal from the input stage is provided to the output stage which in turn generates a corresponding output signal Vout at its output terminal 31. The input stage is a single supply stage, i.e. its power supply connections are between a positive supply rail 4 (to which, in use, a positive supply potential is applied) and a ground rail 5. In contrast, the output stage receives a dual supply—it is connected between the positive supply rail 4 and a negative supply rail 6. In this example, in use the potentials applied to the positive and negative rails are equal in magnitude but opposite in sign (+Vs and −Vs respectively). By operating from this dual polarity supply, the output stage is able to generate an output signal swinging either side of zero volts (i.e. the quiescent output voltage is at ground potential). The output 31 is connected to one side of a load L, which in this case is a headphone speaker. An opposite side of the speaker is connected to ground. Thus, the amplifier is able to drive the speaker with the output signal, but under quiescent conditions, as the output is at ground potential, no current is driven through the load. This is achieved without any coupling capacitors between the output terminal and the load.

Figure 2:
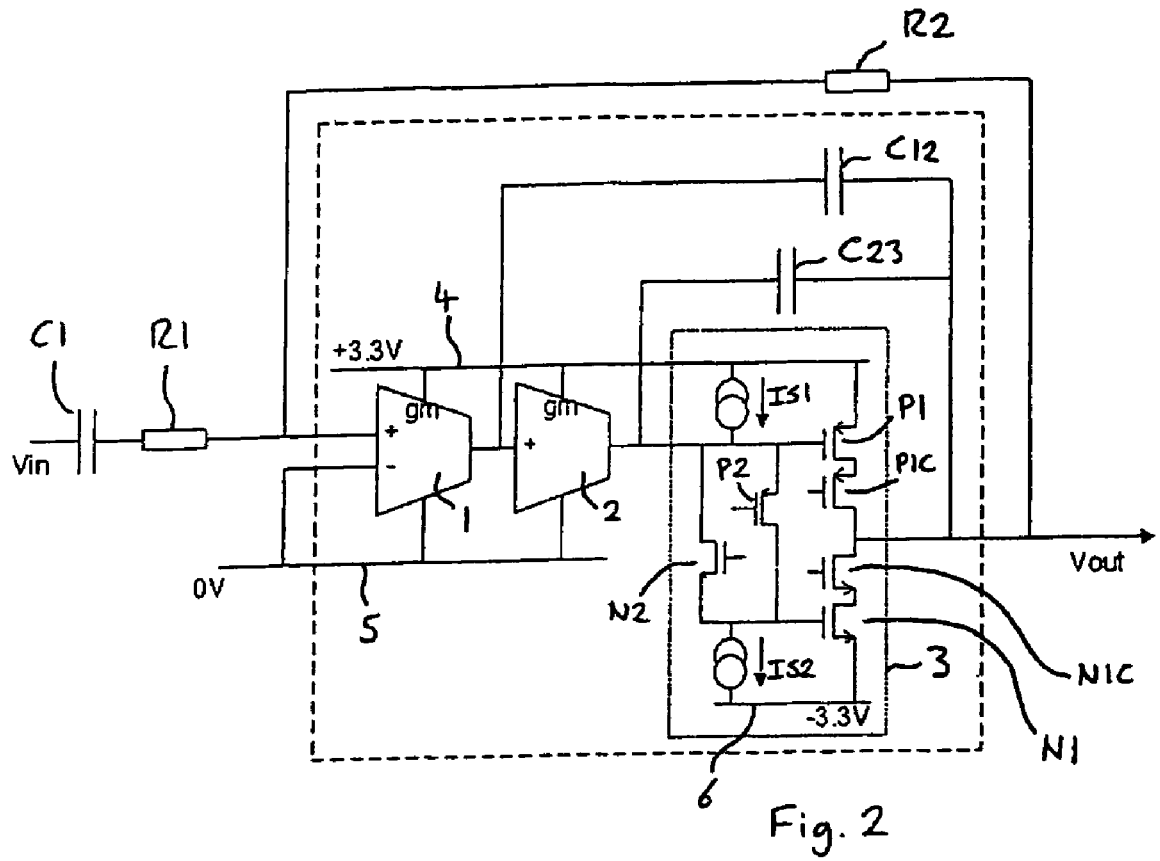
FIG. 2 is a schematic of a three-stage amplifier embodying the invention.

FIG. 2 shows a simplified overview of another amplifier embodying the invention. This is a three stage operational amplifier. There is an input stage 1, a second stage 2, and a third, output stage 3. The third stage in this example is a class AB output stage. It comprises a cascoded pair of PMOS devices P1 and P1C, and a cascoded pair of NMOS devices N1 and N1C, the four devices being connected in series between positive and negative voltage supply rails 4 and 6. The cascode arrangement enables the output stage to provide high voltage swings whilst not subjecting individual devices to unduly high voltage stress. In other words, the series cascode arrangement of devices reduces the Vds (drain-source) per transistor to allow a high voltage output from low voltage MOS technology. Connected in a parallel arrangement between the gates of the devices P1 and N1 are drive transistors N2 and P2, which are also connected to the positive and negative rails 4 and 6 by current sources IS1 and IS2 respectively.

The capacitors C23 and C12 connected between the output stage output and nodes between the second and third stages, and the first and third stages respectively, provide the three-stage op amp with nested Miller compensation.

Thus, unlike conventional op amps, only the output stage of the amplifier shown in FIG. 2 is driven from the negative supply. The input stage uses only positive supply and ground. The negative supply may be noisy, especially if provided from an unregulated capacitor charge pump. This arrangement keeps a noisy negative supply away from the sensitive input stage. Furthermore, the negative feedback around the amplifier effectively attenuates any noise injected into later stages by forward gain to that point. There is also a small saving in power dissipation. It should be noted that an unregulated charge pump supply could have a load regulation of say 0.5V: the resulting 0.5V audio-frequency modulation of the negative supply could be an important source of inter-channel crosstalk (100 dB desirable) or even distortion, if not adequately attenuated. Adequate closedloop rejection of supply noise applied to the output stage is possible because of the gain of the preceding two stages; but if this noisy negative supply were used in the input stage, this supply noise rejection would be impossible practically to achieve.

This constrains the op amp input voltage (i.e. the voltage at the junction of R1 and R2 in FIG. 2) to not be significantly below ground. However, the op amp in FIG. 2 is to be integrated, and so it is possible to specify use only in inverting configuration, for example with resistive feedback via R2 as shown, so that the input common-mode will be at ground. Configurations like that shown in FIG. 2, with input and output voltage at ground, also avoid mismatch of resistors from contributing to output offset voltage. However, the resistor input voltage (at the C1, R1 junction in the figure) will now go below ground. To get Vout>0V, one needs this resistor input voltage to go <0V. Typically, one will use an off-chip a.c. coupling capacitor C1 as shown. (R1 and R2 will typically be 10 kohm–50 kohm, so C1 is small, <1 uF to achieve a −3 dB frequency of say 20 Hz). C1 also prevents offset from circuitry upstream (e.g. a DAC) from propagating through to give additional output offset voltage.

Figure 3:
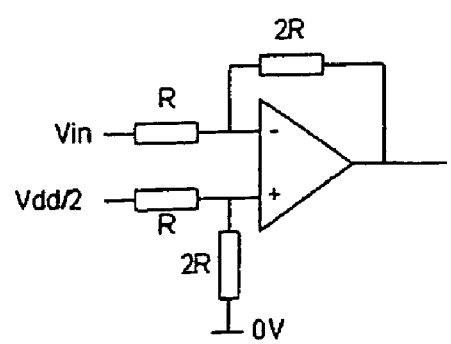
FIG. 3 is a diagram of a level shifter circuit suitable for use in embodiments of the invention.

The circuit of FIG. 2 could also be used with the non-inverting op amp input biased to some voltage not equal to ground, as shown for example in FIG. 3. This would be undesirable when driving a conventional speaker or headphone, but might be appropriate for other loads such as sensors or transducers or depletion-mode FET requiring a non-zero quiescent bias voltage, but also requiring this to be modulated below ground.

The amplifier circuit of FIG. 2 may be integrated in CMOS technology on a common p-substrate (silicon wafer). Conventionally, the p substrate of the whole integrated circuit would be biased to the most negative voltage. i.e. the negative supply voltage 6.

However, this would inject negative supply noise directly into the amplifier input stage, via the substrate connections of the amplifier NMOS devices (N1 and N1C), both through device parasitic capacitances and directly by modulating the body effect on these NMOSs. Moreover, it would mean that the noisy negative voltage supply would be distributed across the whole chip, e.g. to sensitive low-level microphone or magnetic gramophone inputs, again either via parasitic capacitances or via the substrate conductance of NMOS in respective pre-amplifiers. Also, nearly all of the system inputs and outputs (I/O) would be logic or analogue signals referenced between ground and +Vs. Normal digital library cells would have degraded performance because of body effect of at least Vs—applied to all constituent NMOS transistors: this back-bias would also increase the maximum NMOS drain-bulk voltage to equal +Vs−(−Vs) possibly causing device reliability problems. Also, normal cell library input ESD protection and anti-latch-up precautions would need modifications to work. For example, there are normally nwell-substrate diodes on input pads to provide an anti-latch-up diode to ground and an ESD path to ground: these would be less effective if connected to a negative supply, especially an ill-defined charge-pumped supply. So, it would be advantageous to bias the substrate to a cleaner and grounded voltage.

Figure 4:
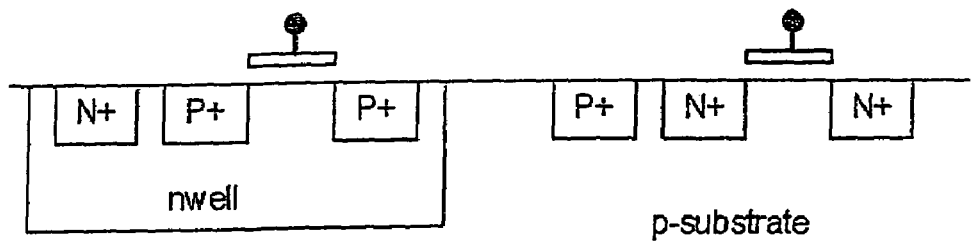
FIG. 4 is a diagram of well structure in conventional CMOS technology.

On a normal CMOS process, connecting the p-substrate to ground but the NMOS source or drain to a negative voltage would forward bias these diffusions. This can be seen from FIG. 4.

Figure 5:
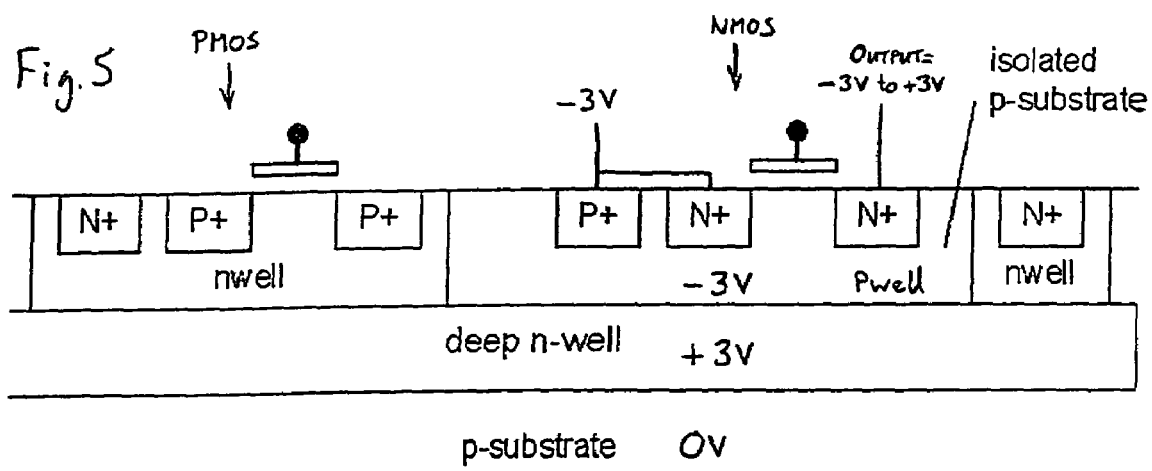
FIG. 5 is a diagram of triple well CMOS structure suitable for use in embodiments of the invention.

However some processes, especially at 0.25 um and below, include a "triple-well" or deep well as standard. These were originally introduced to optimise the substrate bias for different circuit blocks in high-performance memory chips and later used for r.f. isolation and also used for charge pumps (as described in U.S. Pat. No. 6,359,814). This triple well arrangement can also be used to isolate the p-substrate of an amplifier NMOS from the supply connected to the underlying substrate. This arrangement is utilised in certain embodiments of the invention, and is represented in FIG. 5. The NMOS drain and source are located in a pwell, connected to the negative supply voltage. This pwell is itself isolated vertically from the underlying p-substrate (at ground potential) by a deep n-well (connected to the positive supply rail). Lateral isolation is achieved by surrounding this deep n-well by a ring of normal n-well. Thus, although the NMOS source or drain can be supplied with negative voltage (to enable the output of the output stage to swing negative with respect to ground) this does not result in the forward biasing of any n-p junction as the NMOS bulk connection is now connected to the most negative supply voltage.

It will be appreciated that one constraint of this scheme (triple well CMOS implementation with a grounded substrate) is that the PMOS nwells must not be connected to a negative voltage, otherwise the well-substrate junction will forward bias, clamping at a diode voltage below ground and triggering parasitic npn transistors, possibly inducing latch-up. The op amp topology must be selected to not have PMOS nwells under 0V. This is not a major constraint, but special circuit design and possibly layout precautions are required.

Figure 6:
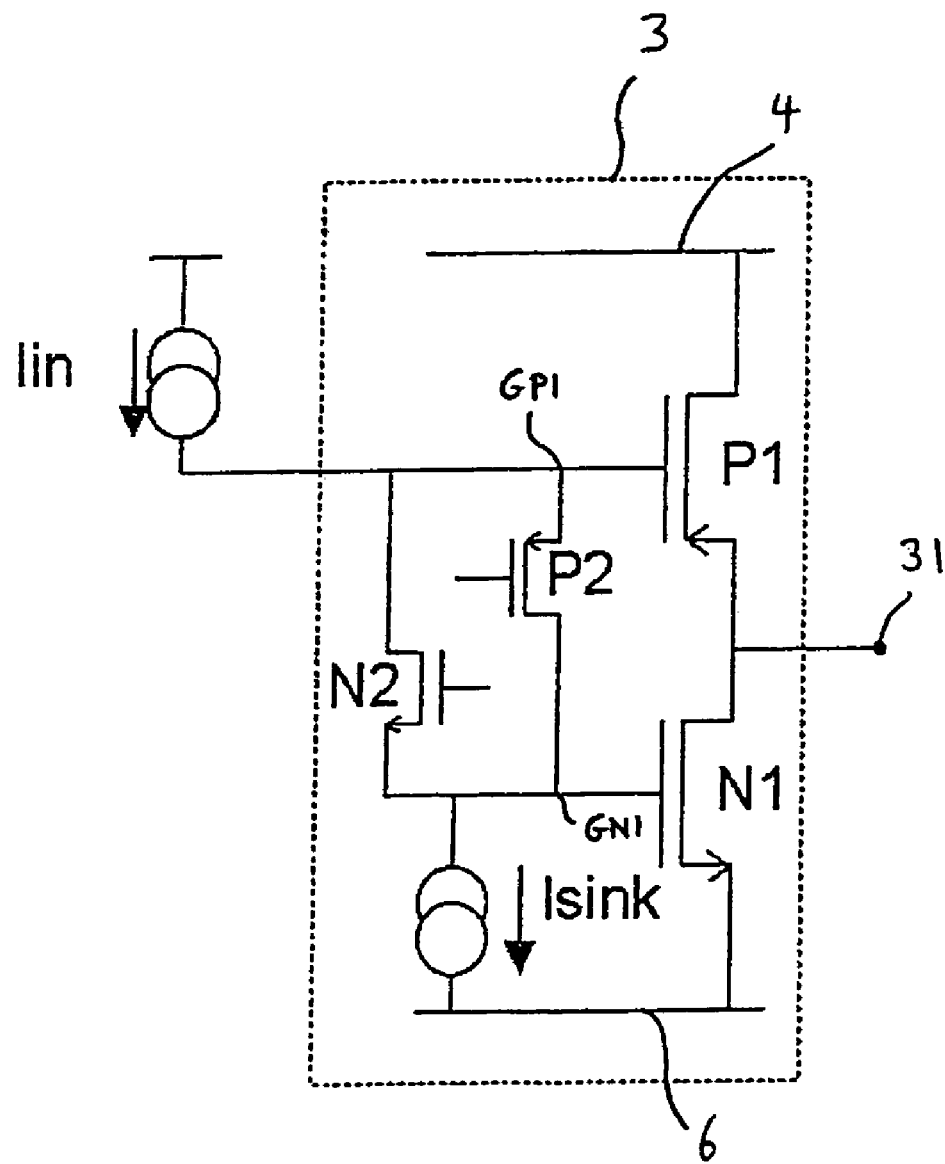
FIG. 6 is a diagram of an output stage suitable for use in embodiments of the invention.

An output stage of an implemented op amp embodying the invention is shown in FIG. 6. This output topology is derived from D. M Monticelli, "A quad CMOS single-supply op amp with rail-to-rail output swing", IEEE J Solid-State Circuits, vol SC-21, pp 1026–1034, December 1986. When Iin=Isink, drive transistors NMOS N2 and PMOS P2 are biased to give roughly equal currents, and so that output transistors N1 and P1 carry a small standing current. For increased Iin sourced into the circuit, node GP1 (P1 gate) will rise, turning P1 off, and passing more current down P2 which in turn will cause node GN1 (N1 gate) to rise, increasing the drive to N1. Conversely decreased source current Iin will have the opposite effect. However in this circuit, output transistors N1 and P1, and drive transistors N2 and P2 can see almost the full supply voltage across their source-drain.

For output supplies of nominally say +/−3.3V on a 3.3V process, this results in breakdown, or at least poor reliability due to hot-carrier stressing for the 3.3V transistors used on this design. It should be noted that 3.3V transistors are available as a standard option for output devices on 0.25V processes, often required in order to be able to provide 3.3V logic output levels compatible with other circuits in a system.

Figure 7:
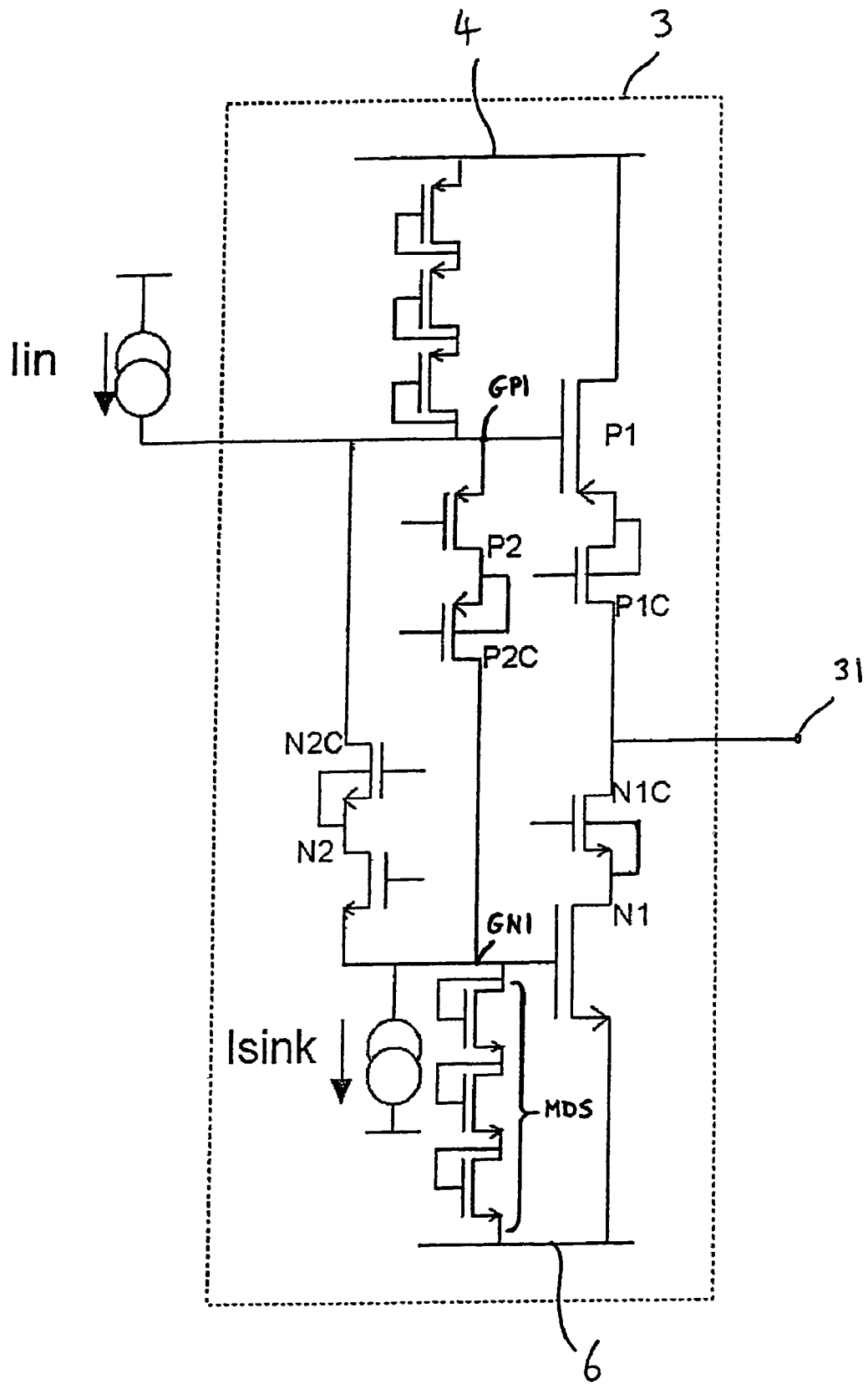
FIG. 7 is a diagram of a preferred output stage employing cascaded transistors.

To prevent this, series cascode devices must be added, as shown in the output circuit of FIG. 7. If the gate voltage of N1C is biased at a voltage about equal to the NMOS threshold voltage Vt above ground, this ensures Vds(N1) <about 3.3V and Vds(N1C)<about 3.3V even when node 31 rises towards +Vs. Note the substrate of N1C is connected to N1C source to also keep the drain-bulk voltage less than about 3.3V even when node 31 rises towards +Vs. Depending on the detailed hot-carrier degradation and diode breakdown characteristics of the process, these bias voltages may be offset slightly to optimise distribution of stress, for example, using hot-carrier degradation forecast on the basis of substrate currents predicted in simulation.

With care in bias design, and good prior hot-carrier degradation characterisation, and possibly extra series cascode devices, it is possible to use say standard 2.5V devices even in a +/−3.3V application, since the maximum voltage of operation is typically set by hot-carrier degradation, (i.e. by drain-source voltage) rather than by oxide reliability (gate-source or gate-drain voltage) or junction breakdown (source-bulk or drain-bulk voltage).

Note that, as with N1C, the substrate of NMOS transistors may be connected to their source, or other appropriate voltage, this adding another degree of freedom to design even in "single-supply" regions of the circuit, for example for eliminating body-effect on amplifier input stages to improve common-mode input range.

Cascode devices N2C, P1C, P2C are biased and operate in a similar fashion As mentioned above, since the substrate is at ground, if an n-well region goes below ground the n-well-substrate diode will forward-bias and pass current. This can cause regenerative latch-up action with other nearby n diffusions. Well-known layout techniques including guard-rings tied to supplies can reduce this risk, but take up substantial die area. These are necessary in any case for devices directly connected to output nodes, such as P1C. However these would not normally be necessary for devices such as P2C. To prevent the well of P2C from forward biasing, even in the presence of substrate leakage or parasitic currents, a low-value (say 5 uA) current source (not shown) can be connected to the well and source connection of P2C.

Also node GN1 (gate of N1) can be pulled nearly to Vdd when N1 is required to sink high current, e.g. when slewing negatively, excessively stressing current sink Isink normally an NMOS. Cascode devices could be added as above to protect Isink, but preferably this node is clamped with MOS diode stacks MDS so that it does not rise more than say 3.3V above −Vs, 6: this has the advantage of also providing some rudimentary short-circuit output current limiting.

Figure 8:
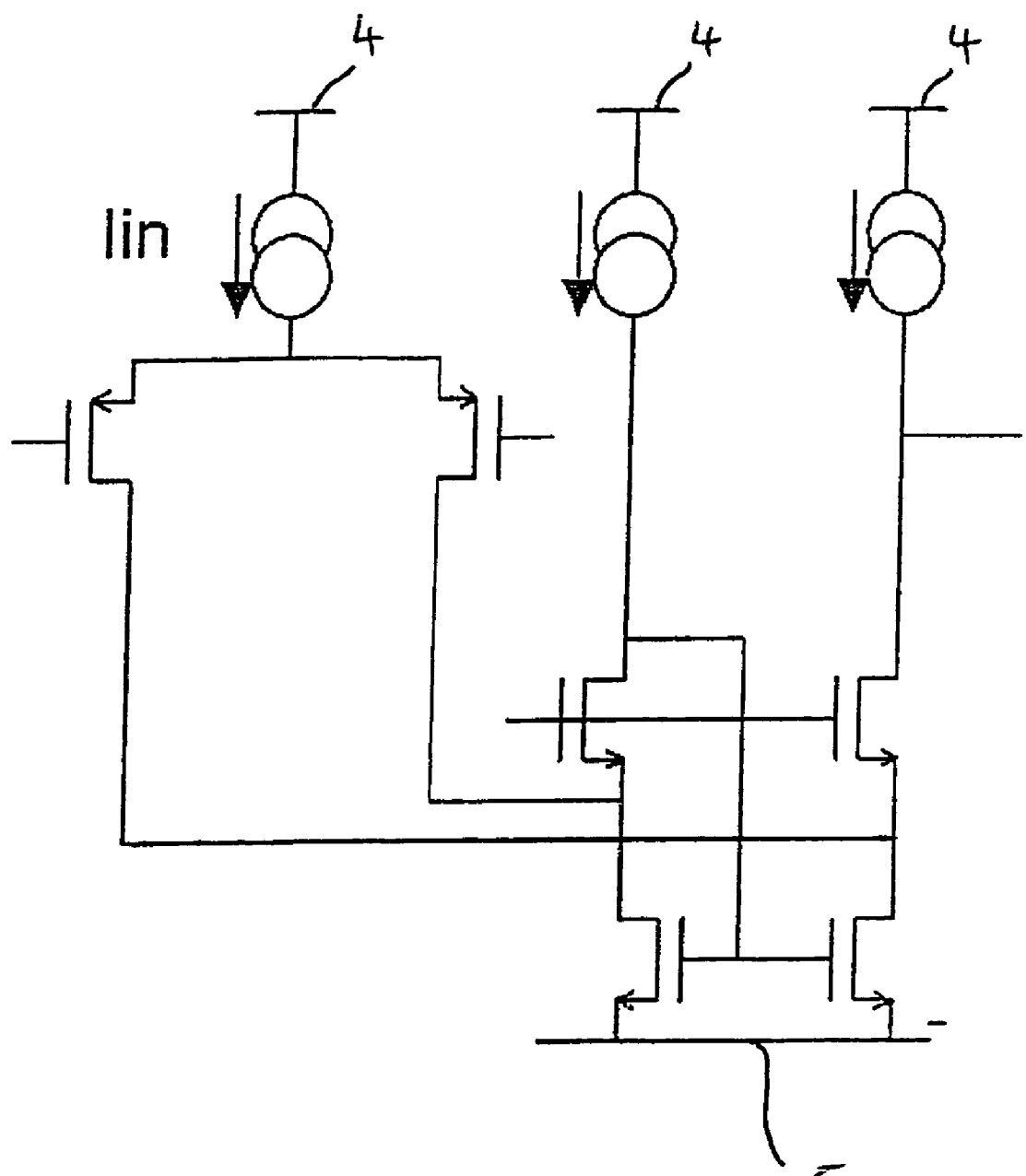
FIG. 8 is a diagram of an input stage suitable for use in embodiments of the invention.

FIG. 8 shows an input stage 1 suitable for use in embodiments of the invention. The input stage is conventional folded-cascode. In certain embodiments, this input stage can be used to drive an output stage directly. However, to get enough loop gain to reduce distortion and improve audio-frequency supply rejection, a 3-stage topology is preferred.

Figure 9:
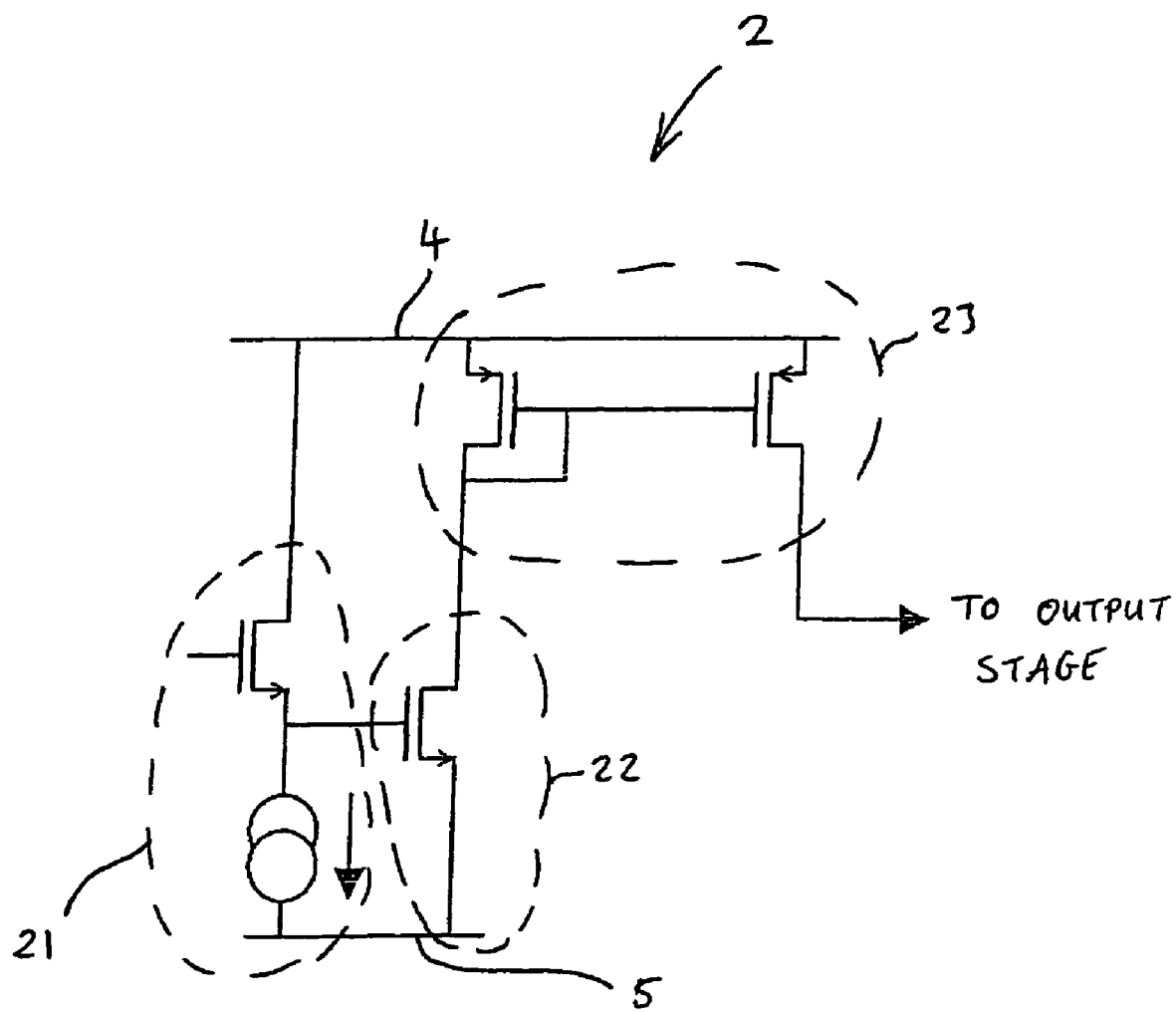
FIG. 9 is a diagram of a second, intermediate amplifier stage suitable for use in embodiments of the invention.

A three stage amplifier embodying the invention utilises a second stage 2 as shown in FIG. 9. This second stage is a non-inverting stage to enable simple nested Miller compensation, and has to drive into the high-side of the output stage. It consists of a common-source stage 22 driving a PMOS mirror 23. To optimise first-stage headroom, an input source-follower stage 21 is included.

Figure 10:
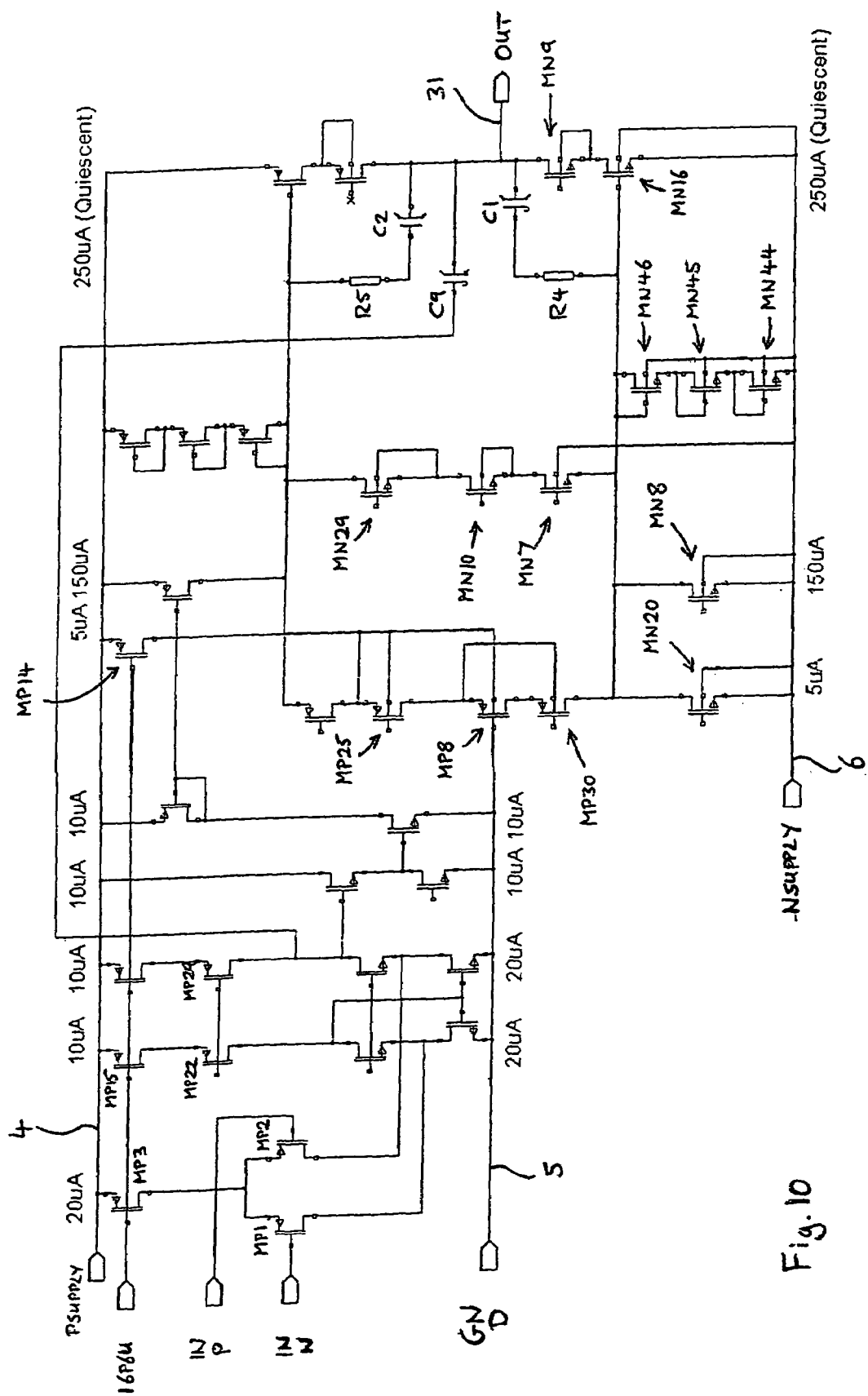
FIG. 10 is a diagram of an amplifier embodying the invention, and incorporating the stages from FIGS. 7, 8, and 9.

FIG. 10 shows a three stage amplifier embodying the invention and comprising the stages from FIGS. 8, 9, and 7 coupled together. The amplifier stages are integrated on a common substrate. Of the numerous MOS devices in the three stages, only the output device MN16, the NMOS clamp transistor MN44 and the NMOS MN8, MN20 implementing Is2 in the third, output stage are directly supplied with a negative supply voltage, with output cascode device MN9, clamp transistors MN45, MN46, and drive transistors MN7, MN10 and MN29 also indirectly seeing this supply. The opportunity for coupling negative supply noise to the output is this drastically reduced compared to a traditional structure. These NMOS devices are implemented using a triple well structure, so the underlying p-substrate can be set at ground potential.

Additional cascode devices MP30, MP8, MN29 have been added in the output stage to reduce voltage stress across devices even in transient overload conditions, as otherwise observed in routine simulations of operation. Bleed current source MP14 ensures the nwell under PMOS MP25 never goes below the substrate ground potential.

The input node marked 16P6PU is biased to an appropriate constant bias voltage using standard circuit techniques to define the bias current of the PMOS to which it is attached. For simplicity, schematic FIG. 10, and other figures, do not include all the necessary MOS gate bias circuitry: MOS gates to which no d.c. path is shown are biased to appropriate fixed bias voltages using standard circuit techniques.

The circuit of FIG. 10 can be implemented on the same substrate as other circuitry, such as a DAC to provide the input voltage, and preceding DSP to provide effects such as digital filtering. It should be noted that the input stage of this amplifier could also have its NMOS isolated in a triple well structure to improve isolation of any digital substrate noise. Of course the interfering digital circuitry could also be isolated in triple well. This would reduce direct coupling from digital NMOS circuitry to amplifier NMOS circuitry via the substrate. However there would still be some capacitive coupling from the digital supply voltage (Vdd) used to bias these deep wells and nwells under digital PMOS circuitry, via the substrate and then picked up by the deep well sunder analogue NMOS or n-wells under analogue PMOS, so care in supply impedances and decoupling is still necessary.

As mentioned above, the negative supply could be provided from elsewhere in the system, especially if already needed by some other part of the system, or could be generated largely on-chip by a capacitive or inductive charge-pump. Even using such a noisy negative supply, the circuit of FIG. 10 provides good negative supply rejection.

It will therefore be appreciated that the embodiment shown in FIG. 10 employs a circuit topology which minimises the number of transistors subject to negative voltages, using a triple-well CMOS arrangement to isolate the negative regions, with cascodes to protect transistors from excessive voltage stress, in a topology which further offers high open-loop gain to allow feedback to improve rejection of noise on the negative supplies.

Figure 11:
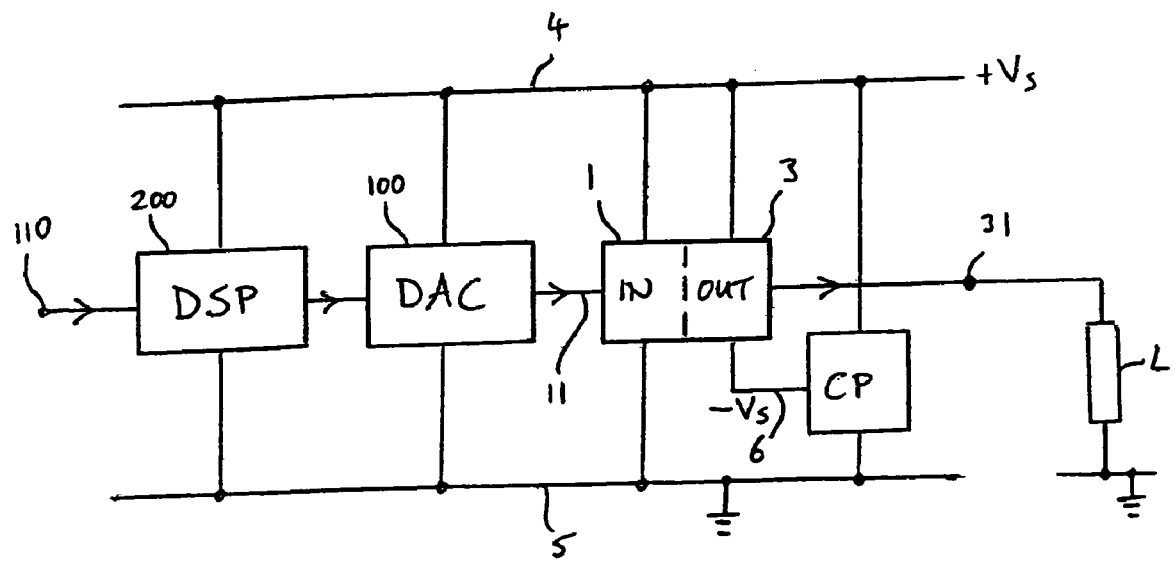
FIG. 11 is a highly schematic representation of an amplifier system embodying the invention.

FIG. 11 shows another amplifier system embodying the invention. This system incorporates an input stage 1, supplied between a positive rail 4 and ground 5, connected to an output stage supplied from the positive rail 4 and from a negative rail 6. The negative rail is supplied with a negative voltage generated by a generating circuit in the form of charge pump circuitry CP, which is itself connected between the positive and ground rails 4,5. Thus, the CP circuitry generates a negative supply voltage from a positive supply voltage. Preceding the two-stage amplifier are a digital signal processor and a DAC. The DSP, with supply connections to the positive rail and ground, receives a digital input signal 110 referenced to ground, processes it and provides a processed digital signal to the DAC. The DAC, operating from the positive rail and ground, delivers an analogue input signal to the first stage input 11, corresponding to the digital signal from the DSP. The output terminal 31 of the ouput stage 3 is connected to a grounded load.

Figure 12:
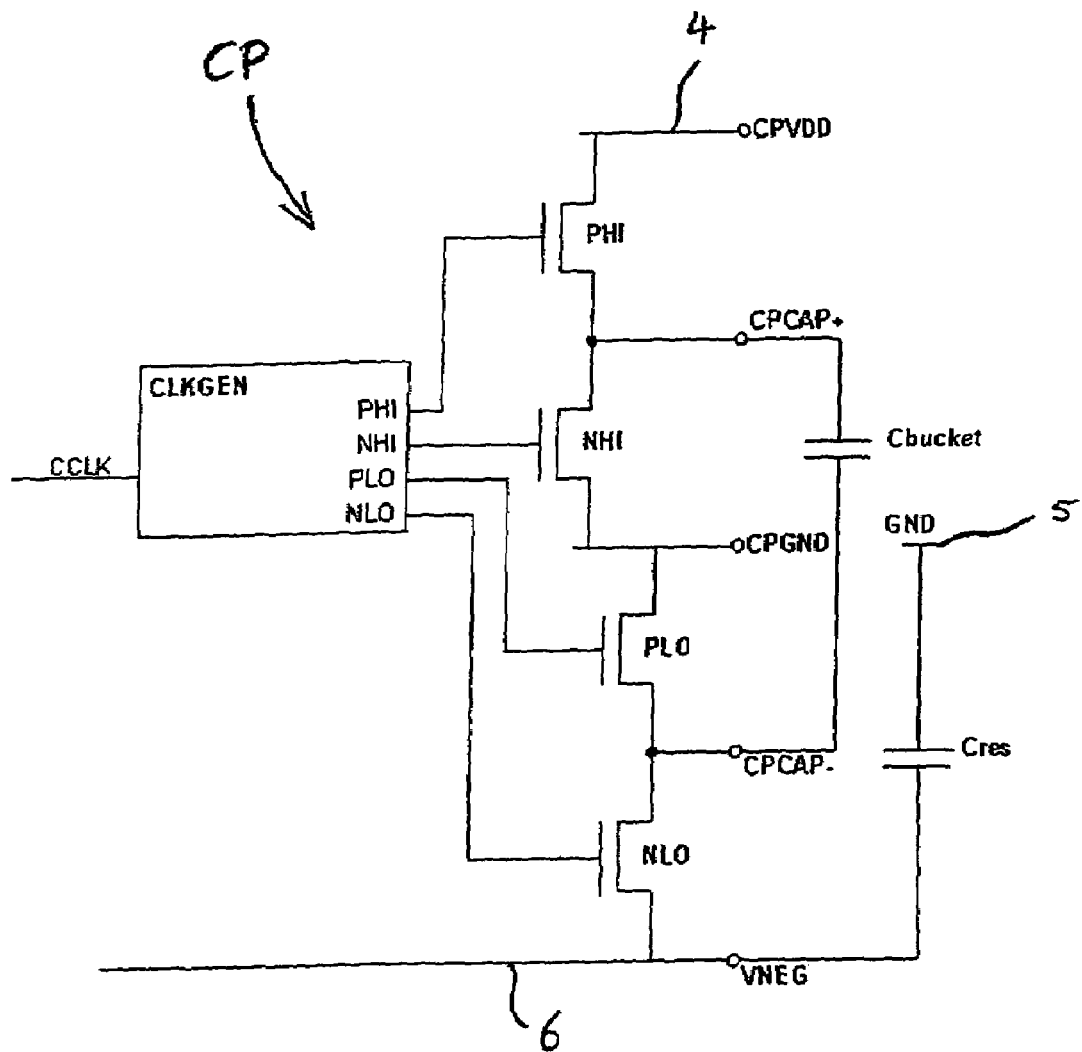
FIG. 12 is a schematic of a charge pump suitable for use in embodiments of the invention.

FIG. 12 shows a simplified schematic of a simple charge pump CP, suitable for use in embodiments of the invention, operating from a positive supply CPVDD 4 and generating a negative supply VNEG 6, with ground connections CPGND and GND. Here CPGND is an on-chip connection, connected via a bonding pads, bond wire, and package pin, to the circuit board ground GND In operation, PMOS PHI and PLO are turned on during one half of a clock cycle to charge up Cbucket. At the end of the half-clock-cycle PHI and PLO are turned off, leaving Cbucket charged up with V(CPVDD) across it. Then NMOS NHI and NLO are turned on. Since terminal CPCAP+ is now connected to ground, the other end of Cbucket is forced low, sharing charge with reservoir capacitor Cres through on transistor NLO. NHI and NLO are turned off at the end of the second half-clock-cycle, and the cycle repeats.

If no load current is taken from Cres, then VNEG will be pumped down in voltage until V(VNEG)=−(V(CPVDD). If load current is taken from CPVDD, then the voltage across Cres will droop during each cycle, and Cbucket will only partially recharge it due to charge-sharing between Cbucket and Cres, so V(VNEG) will not fully reach−(V(CPVDD)).

Clocks at appropriate voltage levels are typically generated by a local clock generator as shown using techniques known to experts in the field.

It will be appreciated that in certain embodiments the positive and negative supply voltages may be substantially equal in magnitude. However, in other embodiments, the supplies need not be exactly balanced. For example, in certain embodiments one could have supplies of +3.3V and −2.5V. This could be to allow for losses in a charge pump or other regulator or convenient voltage supply used.

With regard to embodiments in which the input and output stages are implemented on a common substrate, one future technological possibility is to use deep trenches of oxide for the lateral isolation, but there still remains the need for frequent nwells to supply the bias voltage down to the deep well. Other possibilities would be technologies employing fully dielectric isolation, where the deep well and lateral wells are replaced by insulator (oxide), and technologies such as silicon-on-insulator, where the pwell would be an island on top of say sapphire or oxidised silicon substrate. However, all of these technologies are intrinsically more expensive than the simple junction isolation by the nwell, which therefore represents the preferred implementation, at least until technology shrinks so much that these isolated structures are necessary and become standard. The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. An amplifier comprising an input stage connected to an output stage, the input stage being connected between a positive supply rail and a ground rail and having an input terminal arranged to receive an input signal, the output stage being connected between a positive supply rail and a negative supply rail and having an output terminal, the output stage being adapted to generate an output signal, dependent on a received input signal, at said output, and being further adapted such that, in use, a quiescent voltage at said output terminal is at a selected value between a voltage on the positive supply rail and a voltage on the negative supply rail, wherein the input and output stages are integrated on a common substrate, and wherein the common substrate is connected to the ground rail.

2. An amplifier in accordance with claim 1, wherein the output stage is arranged such that the quiescent voltage at the output is substantially ground potential.

3. An amplifier in accordance with claim 1, and adapted such that a quiescent voltage at said input is substantially ground potential.

4. An amplifier in accordance with claim 1, wherein the input and output stages are connected to a common positive supply rail.

5. An amplifier in accordance with claim 1, wherein the output stage comprises at least one NMOS device, the NMOS device comprising a plurality of n+ source and drain regions arranged in a pwell, the pwell being isolated from the common substrate by an nwell, and the isolated pwell being connected to the negative supply rail.

6. An amplifier in accordance with claim 1, wherein the output stage comprises first and second output transistors connected in series with each other between the positive and negative supply rails, the output of the output stage being provided from a node between the first and second output transistors.

7. An amplifier in accordance with claim 6, further comprising third and fourth output transistors connected in cascode arrangement with the first and second output transistors respectively.

8. An amplifier in accordance with claim 6, further comprising first and second drive transistors connected in parallel between a gate of the first output transistor and a gate of the second output transistor.

9. An amplifier in accordance with claim 8, further comprising third and fourth output transistors connected in cascode arrangement with the first and second output transistors respectively.

10. An amplifier in accordance with claim 1, wherein the input stage comprises a folded cascode arrangement of transistors.

11. An amplifier in accordance with claim 1, wherein the input and output stages are implemented in CMOS technology.

12. An amplifier in accordance with claim 1, further comprising a third stage, connected between the input stage and the output stage, and connected between the positive supply and ground rails between which the input stage is connected.

13. An amplifier in accordance with claim 12, wherein the third stage is non-inverting.

14. An amplifier in accordance with claim 12, wherein the third stage comprises a common-source stage driving a PMOS mirror arrangement.

15. An amplifier in accordance with claim 14, wherein the third stage comprises a source-follower stage driving the common-source stage.

16. An amplifier in accordance with claim 12, wherein the third stage is integrated on the common substrate with the input and output stages.

17. An amplifier in accordance with claim 1, further comprising a digital-to-analogue converter (DAC) arranged to receive a digital signal and output a corresponding analogue signal to the input of the input stage.

18. An amplifier in accordance with claim 17, wherein the DAC is integrated on the common substrate with the input and output stages.

19. An amplifier in accordance with claim 1, further comprising a generating circuit arranged to generate a negative supply voltage from a positive supply voltage, the generating circuit being connected to the same positive supply rail as the output stage, and the negative supply rail being connected to an output of the generating circuit.

20. An amplifier in accordance with claim 19, wherein the generating circuit is arranged to generate a negative supply voltage equal in magnitude to a positive voltage on the positive supply rail.

21. An amplifier in accordance with claim 19, wherein the generating circuit comprises a charge pump.

22. An amplifier in accordance with claim 19, wherein the generating circuit is integrated on the common substrate with the input and output stages.

23. An amplifier in accordance with claim 1, further comprising a power supply connected to the positive supply rail.

24. An amplifier comprising an input stage connected to an output stage, the input stage being connected between a positive supply rail and a ground rail and having an input terminal arranged to receive an input signal, the output stage being connected between a positive supply rail and a negative supply rail and having an output terminal, the output stage being adapted to generate an output signal, dependent on a received input signal, at said output, and being further adapted such that, in use, a quiescent voltage at said output terminal is at a selected value between a voltage on the positive supply rail and a voltage on the negative supply rail, wherein the input and output stages are connected to a common positive supply rail and the amplifier further comprises a generating circuit arranged to generate a negative supply voltage from a positive supply voltage, the generating circuit being connected to the same positive supply rail as the output stage, and the negative supply rail being connected to an output of the generating circuit, and wherein the input and output stages are integrated on a common substrate, the common substrate being connected to the ground rail.

25. A method of driving a load connected to ground, the method comprising the steps of: providing an input signal to the input of an amplifier input stage, the input stage being connected to an output stage; forming the input stage and the output stages on a common substrate; connecting the common substrate to ground; connecting the input stage between a positive supply voltage and ground; connecting the output stage between a positive supply voltage and a negative supply voltage to provide a quiescent output voltage of substantially zero volts at an output from the output stage; using the output stage to generate an output signal at said output, the output signal being dependent on the input signal; and connecting the load to the output to drive the load with the output signal.

26. A method in accordance with claim 25, wherein the step of forming the output stage comprises the step of forming at least one NMOS device, the NMOS device comprising a plurality of n+ source and drain regions arranged in a pwell, the pwell being isolated from the common substrate by an nwell, and the step of connecting the isolated pwell to the negative supply voltage.

27. A method in accordance with claim 25, further comprising the step of generating the negative supply voltage from the positive supply voltage.

28. A method in accordance with claim 25, further comprising the step of driving a headphone with the output signal.

* * * * *